United States Patent [19]

Ohta et al.

[11] 4,382,676

[45] May 10, 1983

[54] POSITIONING MACHINE OF ORIGINAL FILMS ON A BASE SHEET

[75] Inventors: Koichiro Ohta, Chofu; Makoto Kitai, Kyoto, both of Japan

[73] Assignee: Dainippon Screen Seizo Kabushiki Kaisha, Kyoto, Japan

[21] Appl. No.: 243,121

[22] Filed: Mar. 12, 1981

[30] Foreign Application Priority Data

Mar. 21, 1980 [JP] Japan ................................ 55-35886

[51] Int. Cl.³ ............................................. G03B 27/62
[52] U.S. Cl. ....................................... 355/75; 355/54; 355/85
[58] Field of Search ................... 355/32, 53, 54, 75, 355/72, 85, 88

[56] References Cited

U.S. PATENT DOCUMENTS

| | | | |
|---|---|---|---|
| 3,290,990 | 12/1966 | Garlick | 355/54 |
| 3,635,558 | 1/1972 | Le Peer et al. | 355/75 X |
| 3,920,333 | 11/1975 | Wally, Jr. | 355/32 X |

Primary Examiner—Richard A. Wintercorn

[57] ABSTRACT

A positioning machine of original films on a base sheet, wherein a base sheet having a pair of first register pin holes and pairs of second register pin holes is placed on a base plate which is provided with a pair of first register pins and pairs of second register pins corresponding to the first and the second register pin holes, by fitting the first register pins into the first register pin holes, and then the original films, each having a pair of second register pin holes, is positioned on the base sheet by fitting the second register pins into the second register pin holes of the base sheet and the original films.

7 Claims, 8 Drawing Figures

POSITIONING MACHINE OF ORIGINAL FILMS ON A BASE SHEET

BACKGROUND OF THE INVENTION

The present invention relates to a positioning machine of original films for plate making on a base sheet, by which a print including a plurality of pages is obtained in a single operation.

As is well-known, color printing is performed by superimposing different colored inks by employing a plurality of printing plates which are produced by separating an original picture into several colors, such as cyan, magenta, yellow and black.

When a printing layout includes several pictures, each picture is generally color-separated independently and color separation films of each picture are made separately. Then, the color separation films for each color are collated and mounted on a transparent base and are printed in contact with a printing plate material to obtain an original color separation plate for printing of the desired layout.

It is essential that the various color plates print precisely in coincidence, to prevent "color mackle", which would otherwise impair the printing quality, and thus critical that the relative positions of the various pictures, mounted on the layouts for each color, exactly correspond.

Heretofore, several methods have been developed for performing the positioning operation of mounting the color separation films on the layouts. For example, in a conventional method the color separation films for each color are positioned in the desired layout by using register marks attached to a certain position of each color separation film by eye, and in another conventional method the positioning of the color separation films is performed by using a particular film positioning device, as disclosed in Japanese Patent Laying-Open Specification No. 53-93901 (Japanese Patent Application No. 52-7531).

In the latter case, the film positioning device comprises a rotary frame having a right regular polygonal prism shape, which is composed of a plurality of rectangular panels and is intermittently rotated around its axis so that each panel may be positioned in a predetermined position, and a pin-bar including register pins facing downward, which is adapted to be moved over the surface of the panel. A base sheet is mounted to each panel of the rotary frame, and original films of colors separated are consecutively mounted onto the base sheets at the corresponding positions on the panels by using the pin-bar.

This device is a very effective. However, since the rotary frame comprises the rectangular panels assembled in the right regular polygonal prism shape and is rotated, the size of the panels is restricted to be relatively small. Hence, it is not proper for positioning the original films on a large base sheet for a print including a plurality of pages. In FIG. 1 is shown a print or a book composition S including a plurality of pages, for example, eight pages in its one side. It is obtained by printing the eight pages portion in its one side in one operation and then the eight pages portion in the other side in another operation, and thus the obtained print S is folded up three times, thereby obtaining a section or signature of 16 pages.

When the size of one page is an A4 size (210×297 mm), the print S of FIG. 1 has an A1 size (594×841 mm). Therefore, in order to cover the A1 size sufficiently, the panel for mounting the base sheet should be designed to be somewhat larger than the A1 size, and accordingly the positioning device of the type described above will be made in large size. This requires the high cost of facilities, and further the height of working operation is raised, which is inconvenient for the daily work and reduces the productivity accordingly.

Consequently, the device of this kind is preferably made to a relatively small size type, and hence the color separation picture films are positioned in each page. For example, as shown in FIG. 2, on a base sheet 1 for covering one page, color separation picture films 2 and 3 are mounted in the desired layout positions by adhesive tapes 4, and the base sheet 1 is provided with register pin holes 5 adapting to register pins. The base sheet 1 on which the color separation picture films 2 and 3 are mounted, as shown in FIG. 2, will hereinafter be referred to as "an original film P".

SUMMARY OF THE INVENTION

It is an object of the present invention to provide a positioning machine of original films on a base sheet free from the aforementioned defects, which is capable of positioning the original films accurately and quickly.

According to the present invention there is provided a positioning machine of original films on a base sheet, comprising (a) a base plate; a base sheet to be placed on the base plate; (c) a pair of first register pins for positioning the base sheet, which are provided to the base plate; and (d) pairs of second register pins for positioning original films to be mounted onto the base sheet, whose tops are positioned under the upper surface of the base plate and are adapted to be projected beyond the same, each original film having a pair of second register pins, the base sheet having first register pin holes to be filled by the first register pins and the corresponding number of second register pin holes to that thereof, which are positioned in the corresponding positions to the second register pins and are to be fitted thereby.

BRIEF DESCRIPTION OF DRAWINGS

In order that the present invention may be better understood, a preferred embodiment thereof will be described with reference to the accompanying drawings, in which.

DESCRIPTION OF A PREFERRED EMBODIMENT

Figure 1:
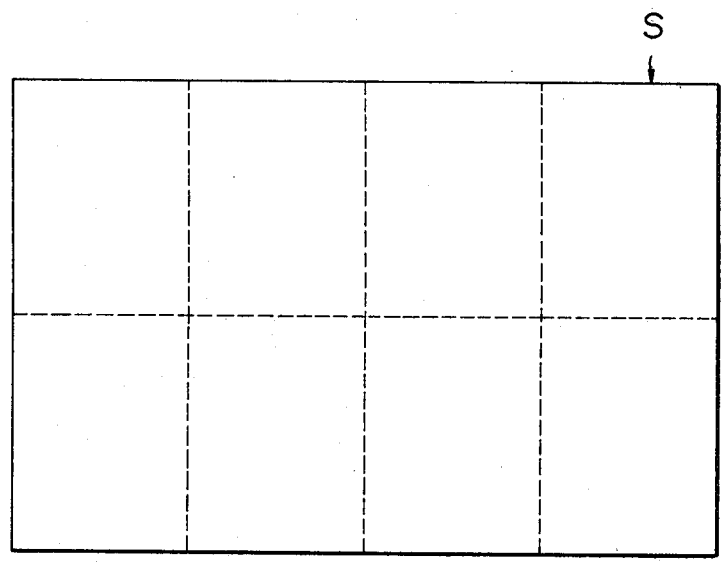
FIG. 1 shows a print or book composition including a plurality of pages before being folded up to a section or signature.

Referring to the drawings there is shown in FIGS. 3-8 a positioning machine according to the present invention.

A base plate 6 which is somewhat larger than the A1 size, is supported horizontally by four legs 7. The base plate 6 comprises a pair of fixed plates 9 which extend from the front to the rear in parallel with each other and are supported by horizontal connection bars 8 connected to the legs 7, and a movable plate 10 which is slidably arranged between the two fixed plates 9 in contact therewith stepwise.

Each fixed plate 9 is provided with upright guide pins 11 in its left or right side end and suction grooves 12 on its upper surface which lead to a suction means (not shown) such as a vacuum pump. The movable plate 10 is provided with eight pairs of positioning pin holes 13 corresponding to the register pin holes 5 of the eight original films P to be aligned in two rows from the front to the rear on the base plate 6.

A transparent base sheet 14 which is somewhat larger than the A1 size, is mounted on the base plate 6 and is provided with guide pin holes 15 and positioning pin holes 16 in the corresponding positions to the guide pins 11 and the positioning pin holes 13 of the movable plate 10.

Figure 5:
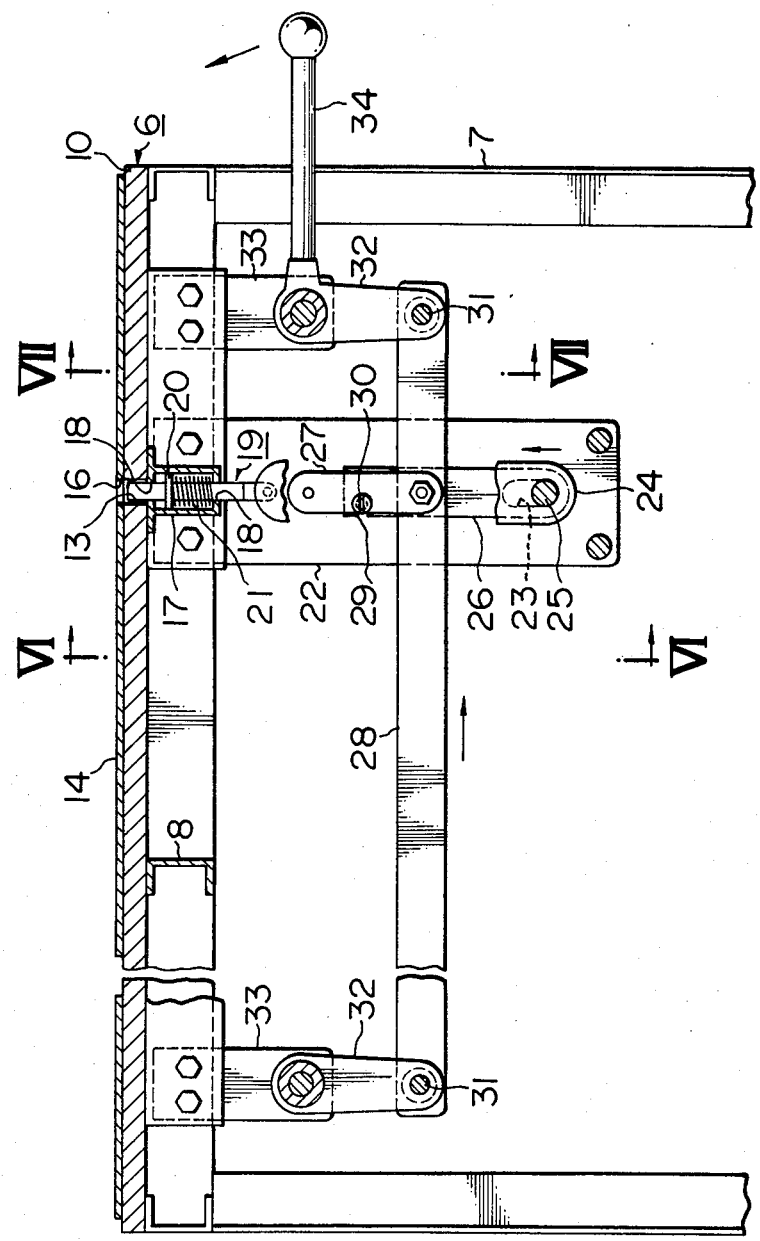
FIG. 5 is an enlarged longitudinal cross-section, taken along the line V—V shown in FIG. 3.
Figure 6:
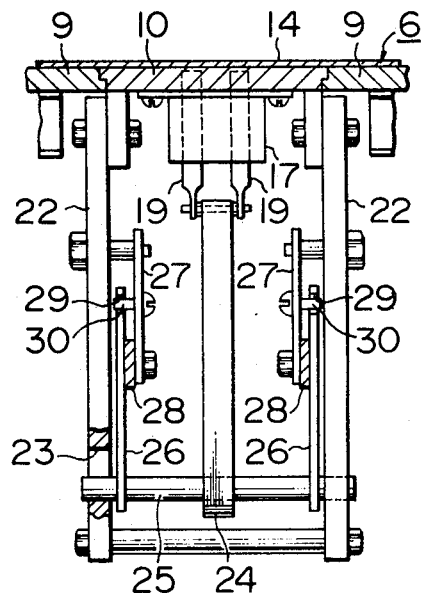
FIG. 6 is a longitudinal cross-section, taken along the line VI—VI shown in FiG. 5.

Under each positioning pin hole 13 of the movable plate 10, as clearly shown in FIGS. 5 and 6, a spring box 17 is mounted on the movable plate 10, and a pair of positioning pins 19 are positioned so as to pass exactly through guide holes 18 formed in the top and the bottom plates of the spring box 17 and the positioning pin holes 13 of the movable plate 10. Each positioning pin 19 is provided with a stop member 20 having a large diameter. A coil spring 21 is arranged around the positioning pin 19 between the stop member 20 and the bottom plate of the spring box 17, and thus the positioning pin 19 is biased upwards so that its top end normally positioned below the upper surface level of the movable plate 10 may be projected beyond it.

A pair of support plates 22 are mounted in parallel onto the lower surface of the movable plate 10 in its side ends so that the support plates 22 and the positioning pins 19 may be aligned along a line, and each support plate 22 is formed with a longitudinal long slot 23 in its lower part. The lower ends of the positioning pins 19 are connected to the top end of a vertical coupling plate 24 via a pin. A horizontal movable shaft 25 is centrally connected to the lower end of the coupling plate 24, and free ends of the movable shaft 25 are slidably up and down positioned in the long slots 23 of the support plates 22.

A pair of stop plates 26 extending upwards, each having a groove 29 cut in a rear end of its upper free end, are pivotally mounted to the free end portion of the movable shaft 25. a pivot plate 27 is pivotally mounted to each support plate 22 in its upper end. The lower end of each pivot plate 27 and an actuating plate 28 extending horizontally from the front to the rear are pivotally mounted to the upper middle part of each stop plate 26. Each pivot plate 27 is provided with a stop pin 30 in its middle part, which is adapted to be engaged with the groove 29 of the stop plate 26 when the top of the positioning pin 19 is positioned under the upper surface level of the movable plate 10, as hereinafter mentioned.

Figure 7:
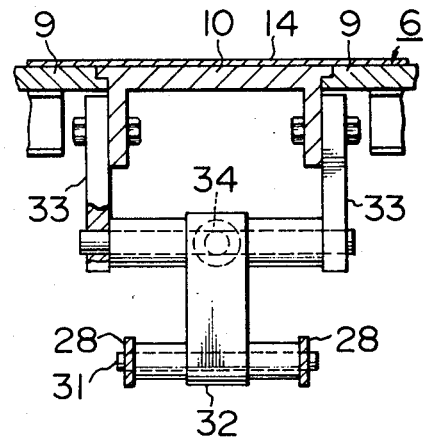
FIG. 7 is a longitudinal cross-section, taken along the line VII—VII shown in FIG. 5.

As clearly shown in FIG. 7, the front and the rear ends of the actuating plates 28 are pivotally connected to lower ends of link members 32 via link pins 31, and the upper ends of the link members 32 are pivotally connected to brackets 33 via a link shaft, which are secured to the lower surface of the movable plate 10. An actuating handle 34 is mounted to the upper front of the front link member 32.

Figure 8:
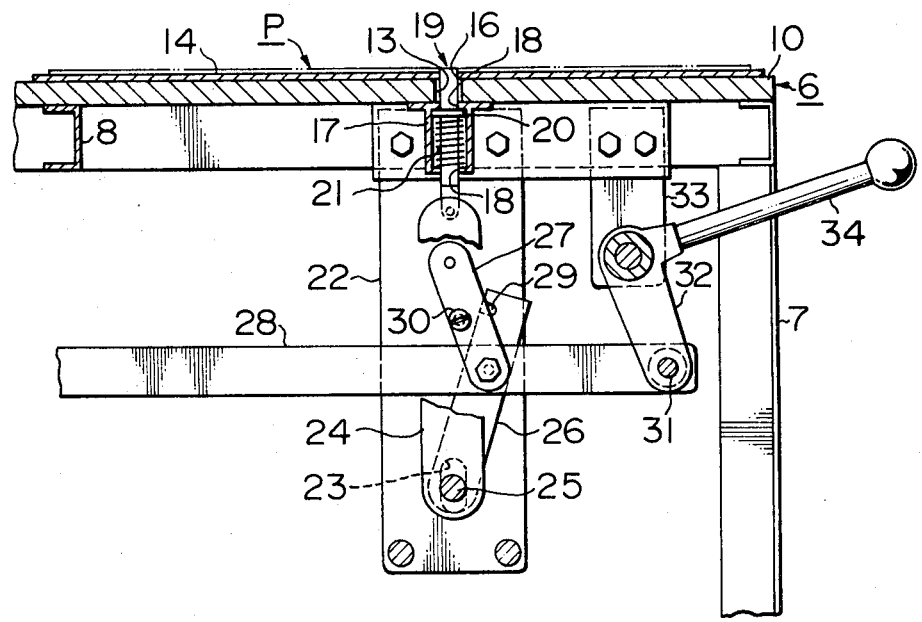
FIG. 8 is a fragmentary longitudinal cross-section, taken along the line V—V shown in FIG. 3, showing an engaged state of the machine of the present invention.

When the tops of the positioning pins 19 are positioned under the upper surface level of the movable plate 10, the grooves 29 of the stop plates 26 are engaged with the stop pins 30 of the pivot plates 27, as shown in FIG. 5. Then, the actuating handle 34 is pivoted upwards, as indicated by an arrow, and the actuating plates are pulled frontwards, in the right hand side direction of FIGS. 5 and 8, thereby releasing the engagement of the grooves 29 of the stop plate 26 from the stop pins 30 of the pivot plates 27 by pivoting the pivot plates 27, and raising the movable shaft 25, as shown in FIG. 8. In the same time, the positioning pins 19 and the coupling plate 24 are moved upwards by the aid of the coil springs 21, and thereby the tops of the positioning pins 19 projecting beyond the upper surface level of the movable plate 10.

By using the positioning machine described above, a large size of color separation original plate of the A1 size for plate-making, as hereinafter referred to as "a large-sized original plate", is produced as follows.

First, the base sheet 14 is so placed on the base plate 6 that the guide pins 11 may be positioned just in the guide pin holes 15 of the base sheet 14, and the suction means is actuated in order to hold the base sheet 14 on the base plate 6 through the suction grooves 12. Then, the handle 34 is pivoted upwards, and the positioning pins 19 are raised so that the tops thereof may be projected beyond the base sheet 14 through the positioning pin holes 16, as described above. Then, the original films P of one color are positioned by fitting the positioning pins 19 into the register pins holes 5 of the original films P, and the original films P are mounted to the base sheet 14 by proper means such as the adhesive tapes, thereby obtaining the large-sized original plate of the one color.

Then, the handle 34 is pushed down and the suction means is deactivated, thereby the tops of the positioning pins 19 being lowered below the upper surface level of the base plate 6, as described above. The large-sized original plate is now readily removed from the base plate 6. This positioning operation is repeated for the other colors to obtain the large-sized original plates of the other colors in the same manner as described above.

Figure 2:
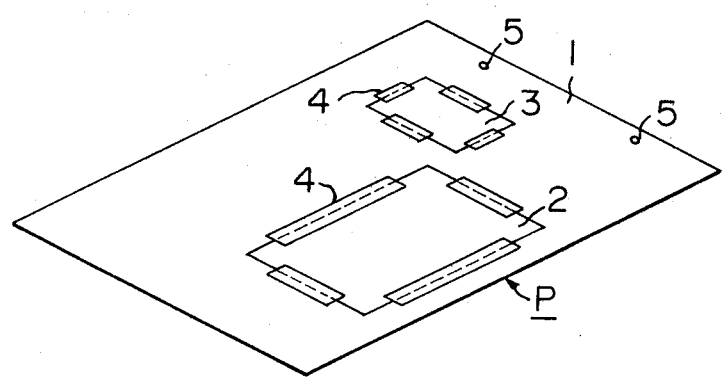
FIG. 2 is a perspective view of an original film corresponding to one page.
Figure 3:
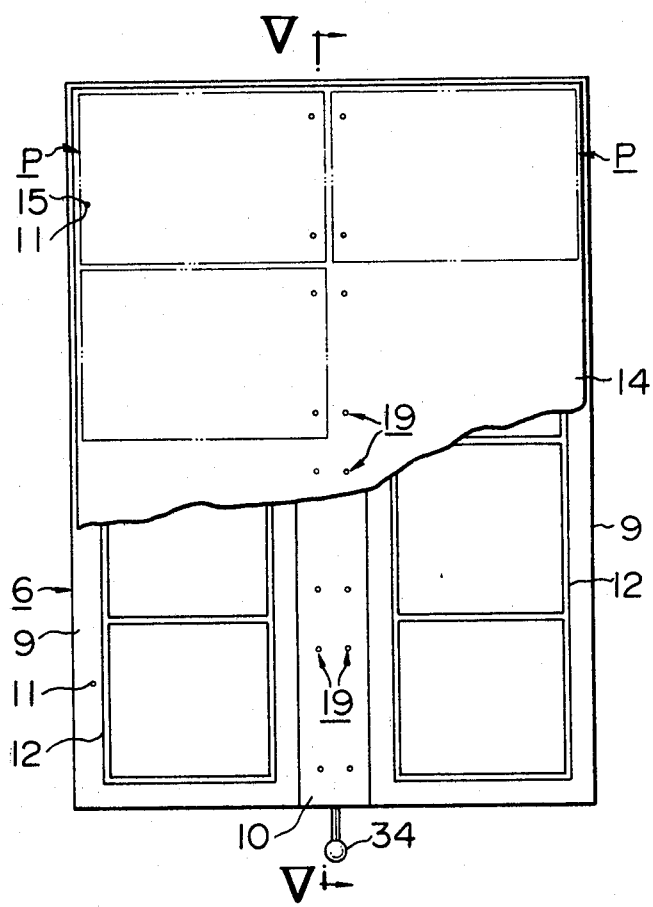
FIG. 3 is a top plan view of a machine according to the present invention.
Figure 4:
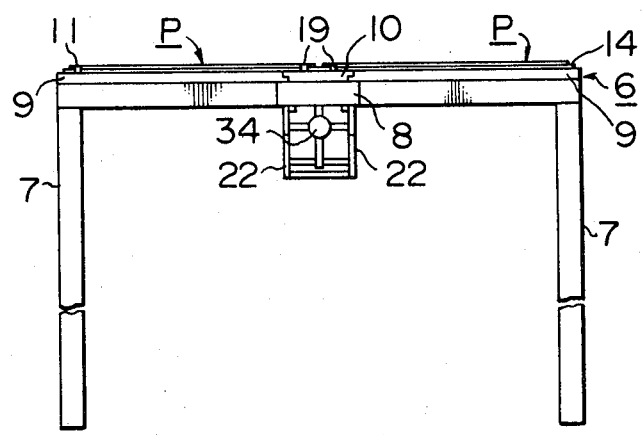
FIG. 4 is an elevational view of FIG. 3.

In this case, the positioning of the base sheet 14 on the base plate 6 is carried out exactly by the guide pins 11 and the guide pin holes 15, and the positioning of the small-sized base sheet 1 of FIG. 2 on the base sheet 14 is performed precisely by the register pin holes 5 and the positioning pins 19, as described above. Therefore, the relative positions of the color separation films 2 and 3 on each original film P are exactly positioned without any skill.

In the embodiment described above, the movable plate 10 is moved frontwards or rearwards so as to move the positioning pins 19 mounted thereto, as occasion demands. Accordingly, it is not moved in the course of the positioning operation, and thus it may be omitted, that is, the base plate 6 may consist of a fixed plate.

According to the present invention, when the mounting of the original films P to the base sheet 14 is carefully carried out, the suction grooves 12 may be omitted. When the base plate 6 is made of a translucent material and a light source is disposed under the base plate 6, the positioning operation described above may be performed more easily.

Although the present invention has been described with reference to a preferred embodiment thereof, however, various changes and modifications can be made by those skilled in the art without departing from the scope of the present invention.

What is claimed is:

1. A positioning machine of original films on a base sheet, comprising:
   (a) a base plate;
   (b) a base sheet to be placed on the base plate;
   (c) a pair of first register pins for positioning the base sheet, which are provided to the base plate; and
   (d) pairs of second register pins for positioning original films to be mounted onto the base sheet, whose tops are positioned under the upper surface of the base plate and are adapted to be projected beyond the same, each original film having a pair of second register pin holes to be filled by each pair of second register pins, the base sheet having first register pin holes to be filled by the first register pins and the corresponding number of second register pin holes to that thereof, which are positioned in the corresponding positions to the second register pins and are to be fitted thereby.

2. A machine as defined in claim 1, wherein the base plate is provided with suction grooves in its upper surface for holding the base sheet, the suction grooves leading to a suction means.

3. A machine as defined in claim 2, wherein the base plate is made of a translucent material and a light sourse is arranged under the base plate.

4. A machine as defined in any of claims 1-3, wherein the second register pins are altogether adapted to be moved so as to adjust their positions.

5. A machine as defined in claim 1, wherein the base plate comprises a pair of fixed plates and a moveable plate.

6. A machine as defined in claim 5, wherein the second register pins have their tops positioned under the upper surface of the moveable plate of base plate, and are adapted to be projected beyond the same.

7. A machine as defined in claim 5, wherein a pair of support plates are mounted in parallel onto the lower surface of the movable plate and support a means for selectively adjusting the pairs of second register pins between the extremes of having the tops of the second register pins projected beyond the upper surface of the base plate, and having the tops of the second register pins being positioned under the upper surface of the base plate.

* * * * *